United States Patent
Frank

(10) Patent No.: US 7,773,005 B2
(45) Date of Patent: Aug. 10, 2010

(54) METHOD AND APPARATUS FOR DECODING VARIABLE LENGTH DATA

(75) Inventor: Michael Frank, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 61 days.

(21) Appl. No.: 12/328,833

(22) Filed: Dec. 5, 2008

(65) Prior Publication Data

US 2010/0141487 A1 Jun. 10, 2010

(51) Int. Cl.
*H03M 7/40* (2006.01)

(52) U.S. Cl. .................. 341/67; 341/65; 712/208; 712/300

(58) Field of Classification Search .................. 341/65, 341/67; 712/300, 208
See application file for complete search history.

(56) References Cited

U.S. PATENT DOCUMENTS 5,963,154 A * 10/1999 Wise et al. .................. 341/67
6,865,668 B1 * 3/2005 Benes et al. ................. 712/300

* cited by examiner

*Primary Examiner*—Jean B Jeanglaude
(74) *Attorney, Agent, or Firm*—Meyertons Hood Kivlin Kowert & Goetzel, P.C.; Jeffrey C. Hood; Mark S. Williams

(57) ABSTRACT

System and method for decompressing data. A compressed data stream including contiguous variable length data blocks is received, each variable length data block including multiple contiguous variable length data fields. A current data block of the contiguous variable length data blocks is stored in one or more registers of a processor. Decoding state information is stored in another register of the processor. A single machine instruction of the processor is loaded. The instruction includes one or more operands corresponding respectively to the one or more registers, and another operand corresponding to the other register, where the other register is further operable as a destination register to store a result of the machine instruction. The instruction is executed to decompress the current data block using the stored decoding state information, including storing the decompressed current data block in the other register. The decompression is repeated for subsequent blocks in the stream.

22 Claims, 3 Drawing Sheets

METHOD AND APPARATUS FOR DECODING VARIABLE LENGTH DATA

FIELD OF THE INVENTION

The present invention relates to the field of data decompression, and more particularly to decoding variable length data.

DESCRIPTION OF THE RELATED ART

With the advent and continued evolution of the information age, the communication, storage, and retrieval of information by computers has become a crucial part of the technical infrastructure underlying large portions of the economy and society. To maximize the efficiency of such operations, data is commonly encoded, e.g., compressed or compacted, to minimize storage footprint, transmission time/bandwidth, etc.

However, since data compression techniques generally rely on patterns in the data to compress the data, e.g., strings of like values, etc., and the compression generally removes such patterns from the data, compressed data appears random. A result of this effective randomness is that branch prediction, a common processor technique that makes predictions regarding the next processor instruction to be performed based on current and recent data, does not work well. Thus, decoding operations, which operate on just such encoded or compressed data, are difficult to optimize at the processor level. Additionally, as is well known in the art, computers typically perform many different tasks substantially concurrently, e.g., via multiple execution threads, where the processor is required to switch between tasks with little or no regard as to whether any particular task has been completed. For example, a computer user may be preparing a text document, checking e-mail, and browsing the web, and streaming digital music from a source on the network, while the computer is also performing various housekeeping tasks, e.g., garbage collection, network-management, peripheral polling, and so forth. Thus, to avoid having to start each task over after a task switch, each task may need to save the state of the task just before the task switch to enable resumption of the task when computation resources are again available. Generally, saving and retrieving such state information for a decoding task requires accessing memory that is external to the processor, which requires processor resources and thus slows the decoding process. Moreover, many standard processor instructions, i.e., assembly language/machine instructions, such as those of x86 processors, are limited to one or two inputs, and one output, thus limiting the resources that may be made available to the instruction.

As mentioned above, the main reasons for compression are bandwidth and memory footprint (cache hit rate and total amount of memory). However, there are many different compression or encoding formats, each of which may have different characteristics, e.g., compression ratios, commensurate data types, and so forth. Data compressed in different bit level packed formats requires a great deal of bit manipulation.

For example, one common encoding/compression technique relates to compression of integer formatted data, e.g., for storage and/or transmission of character data, e.g., ASCII. There are various existing or proposed variable length integer formats, including, for example, the VARINT format proposed for Apache Lucene, which is a high performance search engine. Another variable length format is the UTF-8 character format (8-bit UCS/Unicode Transformation Format). This is a variable-length character encoding format for Unicode, and is able to represent any character in the Unicode standard, yet the initial encoding of byte codes and character assignments for UTF-8 is consistent with ASCII. For these reasons, it is steadily becoming the preferred encoding for e-mail, web pages, and other places where characters are stored or streamed.

UTF-8 encodes each character in one to four octets (8-bit bytes):

1) One byte is needed to encode the 128 US-ASCII characters (Unicode range U+0000 to U+007F).

2) Two bytes are needed for Latin letters with diacritics and for characters from Greek, Cyrillic, Armenian, Hebrew, Arabic, Syriac and Thaana alphabets (Unicode range U+0080 to U+07FF).

3) Three bytes are needed for the rest of the Basic Multilingual Plane (which contains virtually all characters in common use).

4) Four bytes are needed for characters in the other planes of Unicode, which are rarely used in practice.

Yet another variable length format is the LEB128 (Little Endian Base 128) integer format, which is a variable length encoded integer (both signed and unsigned) format used in various applications, e.g., the DWARF 2 (Debug With Attributed Record Format, v2) debugging data format.

To be used, the encoded or compressed data must be decoded or decompressed. Decompressing data in these formats using prior art techniques requires a significant amount of processor, i.e., CPU (central processing unit), time.

For example, the Apache variable-length format for positive integers (mentioned above) is defined where the high-order bit of each byte indicates whether more bytes remain to be read. The low-order seven bits are appended as increasingly more significant bits in the resulting integer value. Thus, values from zero to 127 may be stored in a single byte, values from 128 to 16,383 may be stored in two bytes, and so on.

TABLE 1

Vint Encoding Example

| Value | First Byte | Second Byte | Third Byte |
|---|---|---|---|
| 0 | 00000000 | | |
| 1 | 00000001 | | |
| 2 | 00000010 | | |
| ... | | | |
| 127 | 01111111 | | |
| 128 | 10000000 | 00000001 | |
| 129 | 10000001 | 00000001 | |
| 130 | 10000010 | 00000001 | |
| ... | | | |
| 16383 | 11111111 | 01111111 | |
| 16384 | 10000000 | 10000000 | 00000001 |
| 16385 | 10000001 | 10000000 | 00000001 |
| ... | | | |

The above format is well-known in the industry. Decoding it is difficult and expensive—portable decoders, e.g., in mp3 players, are generally designed to read a byte at a time in a loop, looking for the stop bit in each byte, and shifting pieces into place. This generally works well because portable decoders need to deal with many platforms which lack efficient unaligned access.

Dean Gaudet (of Google, Inc.) has suggested a pair of instructions to accelerate decoding a variation of the above format:

VINDL—extracting the length for the next instruction.

VINTD—decoding the data.

The following is an illustrative implementation of these instructions.

VINTL rs, rd

```
len=0;
for (bit=7; bit<64; bit +=8) {
    ++len;
    If (!(rs & (1ull <<bit)))break;
}
rd=len;
CF=(bit>=64);
// can be used for out of line handling of longer than 8 byte
    varints
VINTD rs, rd
rd=rs & 0x7f;
rd |=(rs & 0x7f00)>>1;
rd |=(rs & 0x7f0000)>>2;
rd |=(rs & 0x7f000000)>>3;
rd |=(rs & 0x7f00000000)>>4;
rd |=(rs & 0x7f0000000000)>>5;
rd |=(rs & 0x7f000000000000)>>6;
rd |=(rs & 0x7f00000000000000>>7;
// same len code as for VINTL
len=0;
for (bit=7; bit<64; bit+=8) {
    ++len;
    If (!(rs & (1ull<<bit))) break;
}
rd &=(1ull<<(7*len))-1;
```

Note that this VInt definition uses the $7^{th}$ bit of each byte as a "continue" bit. There may be definitions of VInt which instead use the $7^{th}$ bit as a "stop" bit, and so the test applied at the end of each byte would be opposite, which could be handled by complementing the bits before using the VINT* instructions, or perhaps the instructions could permit both styles of varint.

Similarly, regarding the LEB128 format, the DWARF debugging information standard unsigned LEB128 format is essentially identical to Vint used in the Apache Software Foundation's Lucene™ product, except it supports longer integers. Apache Lucene™ is a high-performance, full-featured text search engine library implemented in Java, and suitable for applications (especially cross-platform) that require full-text search. The signed LEB128 format is more complex, requiring some support for sign extension.

Unary-Length Varints

A primary difficulty related to software implementations of VInt is the large number of shift operations required. However, note that if the "continue" bits were moved together one could take advantage of various instructions for counting, leading or trading zeroes. Suppose, for example, one wishes to use CTZ (or x86 BSF), then one could start the first byte with the bitstring 0 {n−1 {1}}, where n is the number of bytes of the varint (this is referred to as unary encoding).

Rough definition:
```
// an integer x in the specified ranges may be encoded as
    follows:
//
// x                          varint(x)           length(varint(x))
// 0 . . . 0x7f                (x<<1)|1           1
// 0x80 . . . 0x3fff           (x<<2)|2           2
// 0x4000 . . . 0x1fffff       (x<<3)|4           3
// 0x200000 . . . 0xfffffff    (x<<4)|8           4
//0x10000000 . . . 0x7ffffffff (x<<5)|16          5
// . . .
//
// where length( ) is the length in bytes of the encoding.
```

TABLE 2

Some examples of unary encoding:

| Value | First Byte | Second Byte | Third Byte |
|---|---|---|---|
| 0 | 0x01 | | |
| 1 | 0x03 | | |
| 2 | 0x05 | | |
| . . . | | | |
| 127 | 0xff | | |
| 128 | 0x02 | 0x02 | |
| 129 | 0x06 | 0x02 | |
| 130 | 0x0a | 0x02 | |
| . . . | | | |
| 16383 | 0xfe | 0xff | |
| 16384 | 0x04 | 0x00 | 0x02 |
| 16385 | 0x0c | 0x00 | 0x02 |
| 16386 | 0x14 | 0x00 | 0x02 |

This format may be amenable to existing hardware because it reduces to a BSF, a variable shift, and a mask (note that it may be easiest to retrieve the mask from a small table).

Instructions UVINTL and UVINTD, similar to VINTL and VINTD, have also been proposed. For example, regarding UTF-8 Character Encoding, the bits of a Unicode character are divided into several groups which are then divided among the lower bit positions inside the UTF-8 bytes. A character whose code point is below U+0080 is encoded with a single byte that contains its code point: these characters correspond exactly to the 128 characters of a 7-bit ASCII. In other cases, up to four bytes are required. The most significant bit of these bytes is 1, to prevent confusion with 7-bit ASCII characters and therefore keep standard byte-oriented string processing safe.

TABLE 3

Examples of UTF-8 encoding:

| Code range hexadecimal | Scalar value binary | UTF-8 binary/ hexadecimal | Notes |
|---|---|---|---|
| 000000-00007F 128 Codes | 00000000 00000000 0zzzzzzz | 0zzzzzzz(00-7F) | ASCII equivalence range; byte begins with zero |
| 000080-0007FF 1920 Codes | 00000000 00000yyy yyzzzzzz | 110yyyyy(C2-DF) 10zzzzzz(80-BF) | First byte begins with 110, the following byte begins with 10. |
| 000800-00FFFF 63488 Codes | 00000000 xxxxyyyy yyzzzzzz | 1110xxxx(E0-EF) 10yyyyyy 10zzzzzz | First byte begins with 1110, the following bytes begin with 10. |

TABLE 3-continued

Examples of UTF-8 encoding:

| Code range hexadecimal | Scalar value binary | UTF-8 binary/ hexadecimal | Notes |
|---|---|---|---|
| 010000-10FFFF 1048576 Codes | 000wwwxx xxxxyyyy yyzzzzzz | 11110www(F0-F4) 10xxxxxx 10yyyyyy 10zzzzzz | First byte begins with 11110, the following bytes begin with 10. |

As noted above, LEB128 Integer Encoding is used, for example, in various binary file formats—debug files, loader files and other libraries.

There are two types of LEB128 encoding; the unsigned data format is quite similar to the VInt as described above, except that the number encoded has to cover the entire 64-bit range and therefore the input operand to the encoder may be larger than 64 bits. The signed number encoding requires a sign extension to the full width of the destination operand, using the most significant bit of the decoded value as a sign.

The following is an exemplary prior art algorithm to decode an unsigned LEB128 number:

result=0;
shift=0;
while(true)
{
byte=next byte in input;
result |=(low order 7 bits of byte<<shift);
if (high order bit of bite==0)
break;
shift +=7;
}

The following is an exemplary prior art algorithm to decode a signed LEB128 number.

result=0;
shift=0;
size=number of bits in signed integer;
while(true)
{
byte=next byte in input;
result |=(low order 7 bits of byte<<shift);
shift +=7;
/* sign bit of byte is second high order bit (0x40*/
If (high order bit of byte==0)
break;
}
if ((shift<size) && (sign bit of byte is set))
/* sign extend */
Result |=−(1<<shift);

As may be seen, decoding data in each of these formats is quite expensive in terms of arithmetical and/or shift operations, and may also require numerous accesses of external memory.

Thus, improved systems and methods for decoding compressed data are desired.

SUMMARY OF THE INVENTION

Various embodiments of a system and method for decompressing variable length data are presented.

First, a compressed data stream that includes one or more contiguous variable length data blocks may be received, where each variable length data block includes a plurality of contiguous variable length data fields. In other words, data in the form of a sequence of compressed or compacted data blocks may be received for processing by a processor, e.g., an x86 processor, where each data block in the sequence includes data fields of various lengths, and thus each data block may consequently have a variable length. Note that in various embodiments the data stream may be provided to the processor from the computer system itself, e.g., from memory included on or coupled to the computer system, or from an external device, e.g., from a SAN, one or more client systems coupled to the computer system over a network, e.g., the Internet, etc.

A current data block of the one or more contiguous variable length data blocks may be stored in one or more registers of a processor. For example, in one embodiment, the current data block may be stored in two multimedia extension registers, e.g. xmm0 and xmm1, although other registers and/or numbers of registers may be used as desired, e.g., standard on-chip registers.

Decoding state information may be stored in another register of the processor, e.g., another multimedia extension register, e.g., xmm2. Note, however, that another embodiments, other registers and/or numbers of registers may be used to store this decoding state information. As discussed above in the Background section, computers typically perform many different tasks substantially concurrently, e.g., via multiple execution threads, and the processor is required to switch between tasks while those tasks are yet to complete. Thus, to avoid having to start each task over after a task switch, each task needs to save the state of the task just before the task switch to enable resumption of the task when computation resources are again available. Thus, in one embodiment, the other register of the processor, e.g., xmm2, may be used to save the state of a data decompression/decoding task.

A single machine instruction of the processor may be loaded, e.g., may be received by the processor logic. In one embodiment, the single machine instruction may include one or more operands corresponding respectively to the one or more registers discussed above. For example, in one embodiment, the one or more registers may be or include two registers, and the one or more operands may be or include two operands corresponding to the two registers, e.g., two operands corresponding to xmm0 and xmm1, and another operand corresponding to the other register mentioned above, e.g., xmm2. In one embodiment, the other register may be further operable as a destination register to store a result of the machine instruction. In other words, the register used to store the decoding state information may also be used to store results of the machine instruction. Note that whereas in the case of most machine instructions, e.g., standard x86 machine instructions, each instruction has at most one or two operands, and a single output, in one embodiment, the single machine instruction has three operands, i.e., three inputs, specifically, the two registers that store the current data block, e.g., xmm0 and xmm1, and the other register, e.g., xmm2, that stores the decoding state information.

In some embodiments, the machine instruction may also include another input that specifies the format of the encoded data. This additional input may be or include an immediate value, i.e., a constant value known at compile time, that may indicate to the processor (and the instruction) what the compression format of the encoded data is, and thus, how to decode the data. Note that this value is an input to the instruction, and thus may be considered to be an additional operand; however, note that being an immediate value, this argument may be embedded as part of the instruction stream, and may thus not require being loaded from the data cache. Thus, the immediate value is typically not counted as an operand, because it is taken directly from the instruction stream (last byte of instruction coding). In some embodiments, the immediate value may, e.g., as part of specifying the encoding format, also specify the "chunk size" of the data, i.e., the size of each uncompressed data block.

Said another way, in some embodiments, the single instruction may require three operands and one immediate value as a (constant) parameter (or, alternatively expressed, four operands). This instruction may perform the complete decoding of a single number from a packed data stream in accordance with the immediate value, and provide sufficient information to determine the next action.

The single machine instruction may then be executed to decompress the current data block using the stored decoding state information, including storing the decompressed current data block in the other register.

In one embodiment, executing the single machine instruction may include determining a location of a next data block of the one or more contiguous variable length data blocks, and storing the determined location of the next data block in a further register of the processor. In other words, the single instruction may not only decompress the data block, but may also determine and provide the location, e.g., and offset or address, of the next blocked process as a result. Thus, in this embodiment, the instruction has three operands, i.e., inputs, and two outputs, the decompressed data block and the location of the next block in the stream. This aspect of the instruction is particularly beneficial in an iterative decoding process.

Thus, for example, in one embodiment, the method may further include setting the next data block as the current data block, and performing the above storing a current data block, storing decoding state information, loading, and executing to decode the next data block, where storing the current data block is performed using the determined location of the next data block. Note that in this case, storing the "current" data block actually means storing the next data block, since the current data block has been set to the next block in the sequence. The above setting the next data block and performing the storing a current data block, the storing decoding state information, the loading, and the executing, may be repeated in an iterative manner to decode the compressed data stream. Thus, each successive compressed data block in the stream may be processed using the location determined and returned by the previous iteration.

BRIEF DESCRIPTION OF THE DRAWINGS

A better understanding of the present invention can be obtained when the following detailed description of the preferred embodiment is considered in conjunction with the following drawings, in which.

Figure 1:
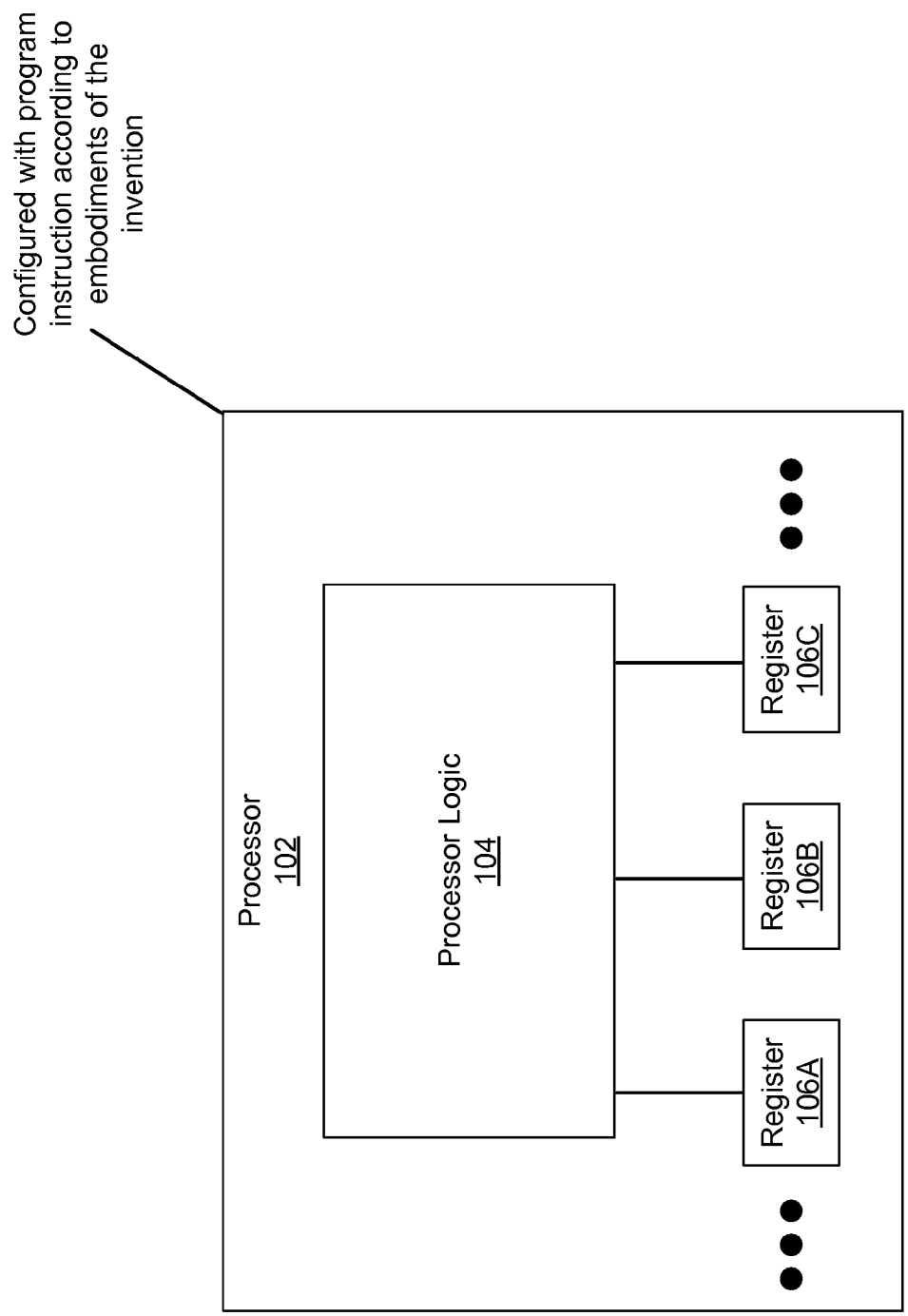
FIG. 1 illustrates a processor configured to decode variable length data, according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (i.e., having the potential to, being able to), not a mandatory sense (i.e., must).

DETAILED DESCRIPTION OF THE INVENTION

FIG. 1

Computer Processor

FIG. 1 illustrates a processor 102 configured to implement the methods described herein. As shown in FIG. 1, the processor 102 may include processor logic 104 and a plurality of on-chip registers, e.g., registers 106A, 106B, and 106C (among others). Note that the number of registers shown and their connectivity are exemplary only, and are not intended to limit the processors contemplated to any particular number, type, or arrangement of registers.

As mentioned above, accessing external memory, i.e., off-processor memory, such as table lookups, storage of intermediate results, etc., can limit performance of decompression operations. Thus, the use of onboard registers, such as registers 106A, 106B, and 106C, can improve the performance of such operations, as will be discussed in more detail below.

Note, however, that the introduction of additional memory registers in a processor architecture may require special modifications of an operating system, which, in general, may not be feasible. For example, the addition of extra registers in an x86 processor architecture, e.g., to support one or more special decompression machine instructions (i.e., assembly instructions), may require modifications to the Microsoft Windows operating system. However, in some embodiments, onboard registers originally provided for one purpose may be available for use by such machine instructions. For example, in one embodiment, multimedia registers (xmm registers) provided for support of multimedia extension instruction sets (e.g., the Streaming SIMD Extensions (SSE) instruction set) may be used by a special decompression machine instruction, as described herein. Thus, in one embodiment, registers 106A, 106B, and 106C, and possibly others, may comprise multimedia extension registers normally used for performing multimedia operations. Such dual use of onboard resources may thus facilitate improvements in performance and efficiency without requiring additional hardware resources. Since each of these multimedia registers, referred to as xmm registers, is 128 bits wide (or long), they may provide ample space for storing input data, results data, and state information.

Embodiments of the present invention may provide a new machine instruction for decompressing encoded data, and may address one or more of the following issues:

1) Bit manipulation—extraction of the data field from a register pair and automatic assembly of one element of integer size may be performed by the new instruction.

2) The new instruction may also provide the next index of the valid data in an array of bytes stored in one or more registers, e.g., a pair of 128-bit xmm registers.

3) The new instruction may provide a single bit indication in a register to indicate that the 256-bit buffer in the pair of registers has been exhausted and new data needs to be loaded from memory.

As will be discussed below in more detail, and in accordance with the above, in one embodiment, the processor 102 may be configured for decompressing a compressed data stream that includes one or more contiguous variable length data blocks, where each variable length data block includes multiple contiguous variable length data fields. The processor may include a plurality of registers (e.g., registers 106A, 106B, and 106C, and possibly others), including a set of one or more registers and another register operable to store decoding state information, as well as processor logic which may be configured with a single machine instruction that includes one or more operands corresponding respectively to the one or more registers, and another operand corresponding to the other register, where the other register is further operable as a destination register to store a result of the machine instruction. The processor logic may be configured to store a current data block of the one or more contiguous variable length data blocks in the one or more registers, store decoding state information in the other register, and execute the single machine instruction to decompress the current data block in the one or more registers using the stored decoding state information, including storing the decompressed current data block in the other register.

FIG. 2

Exemplary Data Retrieval System

Figure 2:
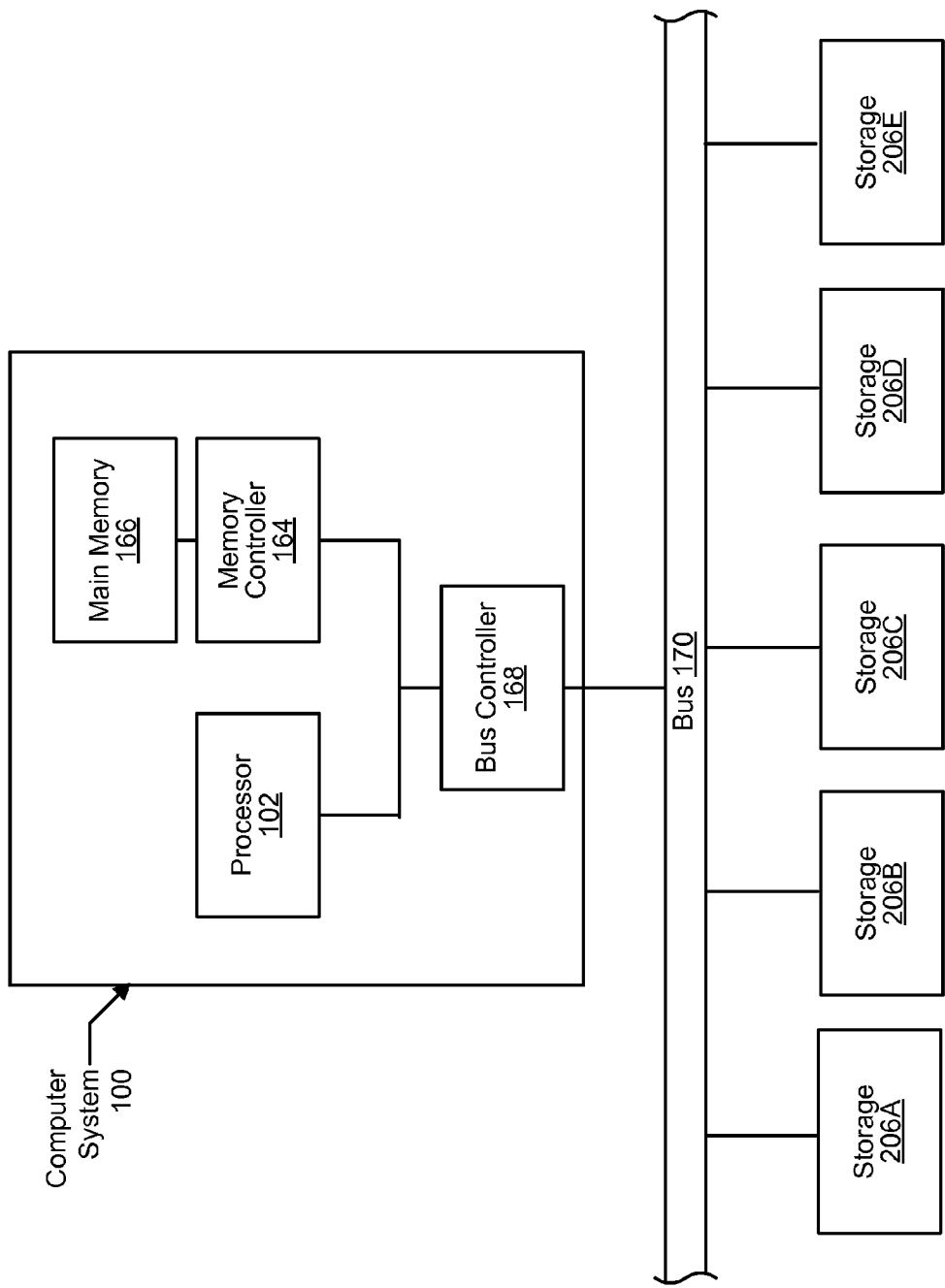
FIG. 2 illustrates an exemplary data server system, according to an embodiment of the present invention.

FIG. 2 is a block diagram representing one embodiment of an exemplary data retrieval system that may utilize and benefit from embodiments of the techniques disclosed herein. As may be seen, this system includes a computer system 100 and multiple storage devices 206A, 206B, 206C, 206D, and 206E, e.g., mass storage devices hosting one or more databases, which may be referred to collectively as storage devices 206, coupled to the computer system 100 via bus 170, e.g., a local area network (LAN), or a wide area network (WAN), such as the Internet.

As FIG. 2 shows, the computer system 100 includes a processor 102, e.g., an embodiment of the processor of FIG. 1, coupled to a main memory 166 through a memory controller 164. These components coupled to the bus 170 through bus controller 168. Note that elements of the computer not necessary to understand the present description have been omitted for simplicity. In some embodiments the computer system 100, and specifically, the processor, has an x86 architecture.

Note, however, that the computer system, bus, and storage devices, are meant to be exemplary only, and that other architectures, numbers and arrangements of storage devices, etc., may be used as desired. For example, in some embodiments, the data retrieval system may include multiple computer systems, e.g., blade servers, coupled to a distributed mass storage system accessible over a network, e.g., a storage area network (SAN). Additionally, noted that data retrieval systems are but one example of systems that may benefit from the techniques described herein, and that any systems or applications that utilize or implement data compression as described herein are contemplated as falling within the scope of the present invention.

FIG. 3

Method for Decoding Variable Length Data

Figure 3:
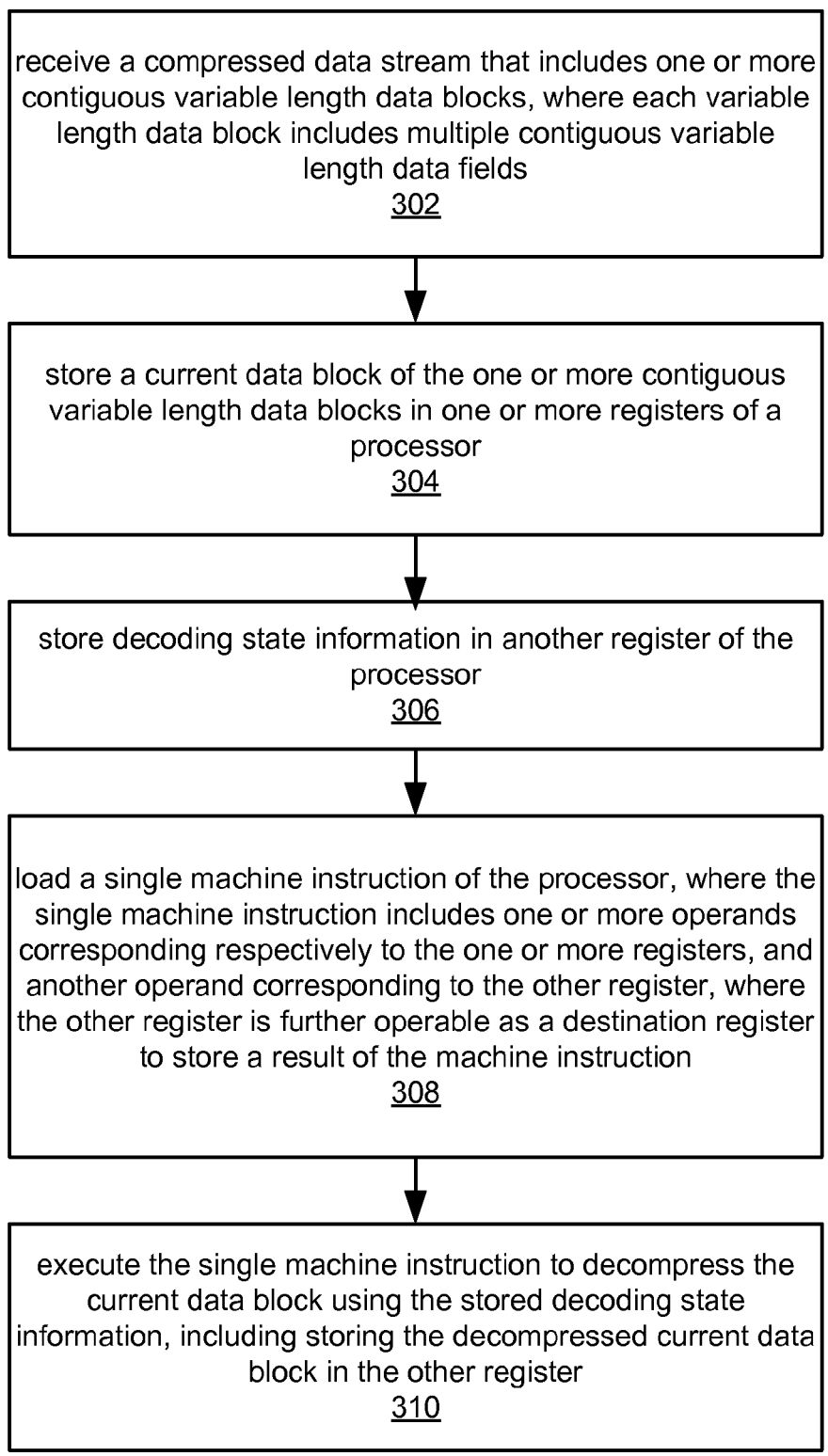
FIG. 3 is a flowchart of a method for decoding variable length data, according to an embodiment of the present invention.

FIG. 3 illustrates a method for decoding of variable length data. The method shown in FIG. 3 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

In 302, a compressed data stream that includes one or more contiguous variable length data blocks may be received, where each variable length data block includes a plurality of contiguous variable length data fields. In other words, data in the form of a sequence of compressed or compacted data blocks may be received for processing by a processor, e.g., processor 102, described above, where each data block in the sequence includes data fields of various lengths, and thus each data block may consequently have a variable length. Note that in various embodiments the data stream may be provided to the processor from the computer system itself, e.g., from memory included on or coupled to the computer system, or from an external device, e.g., from a SAN, one or more client systems coupled to the computer system over a network, e.g., the Internet, etc.

In 304, a current data block of the one or more contiguous variable length data blocks may be stored in one or more registers of a processor. For example, in one embodiment, the current data block may be stored in two multimedia extension registers, e.g. xmm0 and xmm1, although other registers and/or or numbers of registers may be used as desired, e.g., standard on-chip registers.

In 306, decoding state information may be stored in another register of the processor, e.g., another multimedia extension register, e.g., xmm2. Note, however, that another embodiments, other registers and/or numbers of registers may be used to store this decoding state information. As discussed above in the Background section, computers typically perform many different tasks substantially concurrently, e.g., via multiple execution threads, and the processor is required to switch between tasks while those tasks are yet to complete. Thus, to avoid having to start each task over after a task switch, each task needs to save the state of the task just before the task switch to enable resumption of the task when computation resources are again available. Thus, in one embodiment, the other register of the processor, e.g., xmm2, may be used to save the state of a data decompression/decoding task.

In 308, a single machine instruction of the processor may be loaded, e.g., may be received by the processor logic. In one embodiment, the single machine instruction may include one or more operands corresponding respectively to the one or more registers of 304. For example, in one embodiment, the one or more registers may be or include two registers, and the one or more operands may be or include two operands corresponding to the two registers, e.g., two operands corresponding to xmm0 and xmm1, and another operand corresponding to the other register of 306, e.g., xmm2. In one embodiment, the other register may be further operable as a destination register to store a result of the machine instruction. In other words, the register used to store the decoding state information may also be used to store results of the machine instruction. Note that whereas in the case of most machine instructions, e.g., standard x86 machine instructions, each instruction has at most one or two operands, and a single output, in one embodiment, the single machine instruction has three operands, i.e., three inputs, specifically, the two registers that store the current data block, e.g., xmm0 and xmm1, and the other register, e.g., xmm2, that stores the decoding state information.

In some embodiments, the machine instruction may also include another input that specifies the format of the encoded data. This additional input may be or include an immediate value, i.e., a constant value known at compile time, that may indicate to the processor (and the instruction) what the compression format of the encoded data is, and thus, how to decode the data. Note that this value is an input to the instruction, and thus in some embodiments may be considered to be an additional operand; however, note that being an immediate value, this argument may be embedded as part of the instruction stream, and may thus not require being loaded from the data cache. Thus, the immediate value is typically not counted as an operand, because it is taken directly from the instruction stream (last byte of instruction coding). In some embodiments, the immediate value may, e.g., as part of specifying the encoding format, also specify the "chunk size" of the data, i.e., the size of each uncompressed data block.

Said another way, in some embodiments, the single instruction may require three operands and one immediate value as a (constant) parameter (or, alternatively expressed, four operands). This instruction may perform the complete decoding of a single number from a packed data stream in accordance with the immediate value, and provide sufficient information to determine the next action.

In 310, the single machine instruction may be executed to decompress the current data block using the stored decoding state information, including storing the decompressed current data block in the other register. Further details regarding particular embodiments of the instruction and its use are provided below.

In one embodiment, executing the single machine instruction may include determining a location of a next data block of the one or more contiguous variable length data blocks, and storing the determined location of the next data block in a further register of the processor. In other words, the single instruction may not only decompress the data block, but may also determine and provide the location, e.g., and offset or address, of the next blocked process as a result. Thus, in this embodiment, the instruction has three operands, i.e., inputs, and two outputs, the decompressed data block and the location of the next block in the stream. This aspect of the instruction is particularly beneficial in an iterative decoding process.

Thus, for example, in one embodiment, the method may further include setting the next data block as the current data block, and performing the above storing a current data block, storing decoding state information, loading, and executing to decode the next data block, where storing the current data block is performed using the determined location of the next data block. Note that in this case, storing the "current" data block actually means storing the next data block, since the current data block has been set to the next block in the sequence. The above setting the next data block and performing the storing a current data block, the storing decoding state information, the loading, and the executing, may be repeated in an iterative manner to decode the compressed data stream. Thus, each successive compressed data block in the stream may be processed using the location determined and returned by the previous iteration.

Note that because the instruction only uses onboard registers, executing the single machine instruction does not reference external memory, thus avoiding the expense in resources and time required for such external references. As noted above, in one embodiment of processor has an x86 architecture which includes multimedia extension registers for performing multimedia operations, e.g., 16 of such registers. Thus, in one embodiment, the one or more registers and the other register used by the instruction may include multimedia extension registers for performing multimedia operations. The processor may be configured to operate under an operating system, e.g., Microsoft Windows, MacOS, etc. In some embodiments, because the single decompression machine instruction only requires resources available on standard processors, e.g., standard x86 processors, the single machine instruction of the processor may not require modification of the operating system to execute.

For example, the following is one exemplary embodiment of such an instruction:

VDECOQ dest, xmm0, xmm1, xmm2=dest, imm8

Note that in this embodiment, which is directed to the Advanced Micro Devices (AMD) x86 processor architecture, the instruction uses a 3-operand instruction format, and the operands provide all information required to parse the stream. Note further that the result in the destination register contains the extracted data and updated state information for the parser, while the immediate value (imm8) determines the format of the data stream: e.g., Varint, unary Varint, signed/unsigned LEB, UTF-8 (among others), and the polarity of continuation bits. Of course, the above instruction is exemplary only, and is not intended to limit the instruction to any particular name, form, arguments, or results. In some embodiments, executing the single machine instruction may include converting the single machine instruction to two or more microcode instructions, and executing the two or more microcode instructions. In other words, the single machine instruction may be a complex machine instruction that may be converted or decomposed into micro-instructions that may be executed collectively to perform the decoding functionality. For example, in one embodiment, the single instruction may be broken into a sequence of micro-instructions to perform one or more elements of the method described above, e.g., control pattern generation, next address calculation, etc.

For purposes of illustration, the above example instruction is used in the following descriptions, although it should be noted that in various embodiments, the instruction may take other forms and arguments, and may produce other outputs.

Functionality:

Following the exemplary example above, the two register operands xmm0 and xmm1 (each 128 bits long) may hold the source data, thus forming a 256-bit wide window into the decoded data stream. The third operand xmm2 may be the same register as destination ("dest"), and, in one embodiment, contains the following decode state in the lower 64 bits:

xmm2[4:0]: NEXT=an 8 bit index into the 32-byte array created by {xmm1, xmm0}—only the lower five bits of the index are valid, values 0 . . . 15 select the corresponding start byte in xmm0; a value greater than 16 indicates the start byte is located in xmm1 and (unless the programmer knows that this was the last oct-word) another 128 bits have to be fetched from memory. The NEXT field will always be updated by the instruction to point to the start of the next compressed value.

If imm8[7] is zero, the next execution of VDECOQ will ignore a set NEXT[4], use data in xmm0 for the next decode and clear NEXT[4].

xmm2[7:5]: 3'b000 xmm2[15:0]: SIZE=this field is not used as an input to the instruction, as a result it returns the number of bytes consumed by the last execution.

xmm2[16]: GETDATA=this bit is a copy of NEXT[4], it indicates that as a result of executing the instruction, the index moved from xmm0 to xmm1.

xmm2[17]: CONTINUE=this bit indicates that the decoder has encountered a data field that does not fit into 64 bits—this requires some software intervention. The NEXT field points to the correct index (at the last byte that has been decoded) the overflow field contains a left adjusted mask of set bits that cover all not used bits in the last, partially decoded source byte.

xmm[39:32]: OVERFLOW=8 bit mask, the bits that have been consumed by the last decode are cleared. This mask can be used by software to fixup and merge the currently decoded value with the next decoded value—this allows integers of arbitrary length to be decoded.

xmm[63:40]: 24'h000000 xmm2[127:64]: VALUE=value decoded by applying decode algorithm. For unsigned numbers and UTF-8 characters, the most significant unused bits of VALUE will be set to 0. For signed integers, the most significant decoded bit will be replicated into all unused MSB's. Software can then decide to save the correct number of bits, based on the size of integer it expects.

As indicated above with respect to the "xmm2[17]: CONTINUE" portion of the xmm2 register, in some embodiments, for cases where the decompressed data field, i.e., data chunk, is or would be greater than 64 bits, the compressed data may be passed to software for decompression, i.e., the decompression or decoding operation for this particular chunk of data may be performed by software, i.e., at a higher level.

As noted above, the 8 bit immediate value (imm8) supplied to the instruction may determine the format of the decoded data stream:

imm8[2:0]: 000=Varint—as specified by Apache
001=unary Varint (Google)
010=UTF-8
011=UTF-8
100=unsigned LEB128
101=signed LEB128
(Of course, other formats may be accommodated as desired)
imm8[3]: Invert bit 7 for VarInt/LEB128 decode Of course, the above is exemplary only, and other data, codes, arrangements and/or formats may be used as desired.

In one embodiment, the instruction implementation may take advantage of the hardware that exists for the PPERM instruction (of the standard AMD x86 SSE5 (Streaming SIMD (Single Instruction, Multiple Data) Extensions v5) instruction set), the only extra hardware that may be required is a decoder that looks at the MSB (Most Significant Bit)'s (Varint, LEB128 and UTF-8) or the LSB(Least Significant Bit)'s (unary Varint), a mask generator and a little bit of 5-bit arithmetic for the index calculation. In another embodiment, a further optimization may be implemented where the carry flag is set when NEXT[4] is set. This may allow a PTEST instruction to be used in the loop construct to check for the loop termination condition.

How to Use the Instruction:

These instructions may generally operate in a loop iterating over large numbers of variable-length encoded data. Using the xmm registers (or equivalents) as temporary buffers has the advantage of fewer memory references and address calculations. Moreover, since the decoder state/control state is maintained in standard chip registers (e.g., xmm registers), and the operating system automatically knows how to save standard registers during task switches, saving state for the decoding task may be performed automatically, with no modifications to the OS required.

The following example implements a loop over a set of compressed data, where the data are decoded and accumulated, and the loop exits when the sum reaches a defined termination value.

Example Iterative Decoding

```
uint8 config=0; // varint decode
uint128*p=block;
uint64 sum=0; // could be top 64 bits in xmm3
xmm0=0; // set start index to first byte
xmm1=*p++;
xmm2=*p++; // now buffer is filled
do {
    xmm0=VDECOQ (xmm1, xmm2, xmm0, config);
    sum=addq(sum, xmm.value); // calculate sum
    if (xmm0.next>15) {// read next 128 bits
        xmm1=xmm2;
        xmm2=*p++;
    }
}while (sum<goal);
```

In one exemplary embodiment, the body of the loop may read thusly:

| PUNPCKLQDQ | xmm3, [GOAL] | ; get goal into top 64 bits |
|---|---|---|
| MOVAPS | xmm4, [#testpattern] | ; set mask bit for sign test |
| MOVAPS | xmm2, [rdx] | ; load first 16 bytes |
| ADD | rdx, 16 | ; next entry |
| MOVAPS | xmm1, [rdx] | ; load next 16 bytes |
| ADD | rdx, 16 | ; next entry |
| XORPS | xmm0, xmm0 | ; reset NEXT and VALUE |
| loop: | | |
| PSUBQ | xmm3, xmm0 | |
| PTEST | xmm3, xmm4 | ; test for negative sum in xxm4 |
| JC | done | |
| VDECOQ | xmm0, xmm1, xmm2, xmm0, #0 | |
| JNC | loop | ; continue with next |
| MOVAPS | xmm1, xmm2 | ; get next 128 bits |
| MOVAPS | xmm2, [rdx] | |
| ADD | rdx, 16 | ; increment address |
| Jmp | loop | |
| done: | | ; done-goal has been reached |

As may be seen, in the above exemplary code, the decoding process is performed without recourse to off-chip memory accesses, which may significantly improve performance of the process over prior art approaches, and may further provide economic benefits due to the use of standard chip resources, e.g., by obviating customization of the operating system.

Thus, embodiments of the above described techniques may facilitate efficient, i.e., fast, decompression of variable length data.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A method for decompressing data, comprising:
   receiving a compressed data stream comprising one or more contiguous variable length data blocks, wherein each variable length data block comprises a plurality of contiguous variable length data fields;
   storing a current data block of the one or more contiguous variable length data blocks in one or more registers of a processor;
   storing decoding state information in another register of the processor;
   loading a single machine instruction of the processor, wherein the single machine instruction comprises one or more operands corresponding respectively to the one or more registers, and another operand corresponding to the other register, wherein the other register is further operable as a destination register to store a result of the machine instruction; and
   executing the single machine instruction to decompress the current data block using the stored decoding state information, including storing the decompressed current data block in the other register.

2. The method of claim 1, wherein said executing the single machine instruction comprises:
   determining a location of a next data block of the one or more contiguous variable length data blocks; and
   storing the determined location of the next data block in a further register of the processor.

3. The method of claim 2, further comprising:
   setting the next data block as the current data block; and
   performing said storing a current data block, said storing decoding state information, said loading, and said executing to decode the next data block, wherein said storing the current data block is performed using the determined location of the next data block.

4. The method of claim 3, further comprising:
   repeating said setting the next data block and said performing said storing a current data block, said storing decoding state information, said loading, and said executing, in an iterative manner to decode the compressed data stream.

5. The method of claim 1, wherein said executing the single machine instruction does not reference external memory.

6. The method of claim 1, wherein the processor has an x86 architecture.

7. The method of claim 1, wherein the one or more registers and the other register comprise multimedia extension registers for performing multimedia operations.

8. The method of claim 1, wherein the processor is configured to operate under an operating system, and wherein the single machine instruction of the processor does not require modification of the operating system to execute.

9. The method of claim 1, wherein the one or more registers comprise two registers, and wherein the one or more operands comprise two operands corresponding to the two registers.

10. The method of claim 9, wherein the one or more operands further comprise an immediate value that specifies an encoding format of the compressed data stream, and wherein said executing the single machine instruction comprises decompressing the current data block in accordance with the encoding format specified by the immediate value.

11. The method of claim 1, wherein said executing the single machine instruction comprises:
   converting the single machine instruction to two or more microcode instructions; and
   executing the two or more microcode instructions.

12. A processor for decompressing a compressed data stream comprising one or more contiguous variable length data blocks, wherein each variable length data block comprises a plurality of contiguous variable length data fields, the processor comprising:
   a plurality of registers, wherein the plurality of registers comprise a set of one or more registers and another register operable to store decoding state information; and
   processor logic, wherein the processor logic is configured with a single machine instruction that comprises one or more operands corresponding respectively to the one or more registers, and another operand corresponding to the other register, wherein the other register is further operable as a destination register to store a result of the machine instruction;
   wherein the processor logic is configured to:
      store a current data block of the one or more contiguous variable length data blocks in the one or more registers;
      store decoding state information in the other register;
      execute the single machine instruction to decompress the current data block in the one or more registers using the stored decoding state information, including storing the decompressed current data block in the other register.

13. The processor of claim 12, wherein to execute the single machine instruction, the processor logic is configured to:
   determine a location of a next data block of the one or more contiguous variable length data blocks; and
   store the determined location of the next data block in a further register of the processor.

14. The processor of claim 13, wherein the processor logic is further configured to:
   set the next data block as the current data block; and
   perform said storing a current data block, said storing decoding state information, said loading, and said executing to decode the next data block;
   wherein, to store a current data block, the processor logic is configured to store the current data block using the determined location of the next data block.

15. The processor of claim 14, wherein the processor logic is further configured to:
   repeat said setting the next data block and said performing said storing a current data block, said storing decoding state information, said loading, and said executing, in an iterative manner to decode the compressed data stream.

16. The processor of claim 12, wherein to execute the single machine instruction, the processor logic does not reference external memory.

17. The processor of claim 12, wherein the processor has an x86 architecture.

18. The processor of claim 12, wherein the one or more registers and the other register comprise multimedia extension registers for performing multimedia operations.

19. The processor of claim 12, wherein the processor is configured to operate under an operating system, and wherein the single machine instruction of the processor does not require modification of operating system to execute.

20. The processor of claim 12, wherein the one or more registers comprise two registers, and wherein the one or more operands comprise two operands.

21. The method of claim 20, wherein the one or more operands further comprise an immediate value that specifies an encoding format of the compressed data stream, and wherein said executing the single machine instruction comprises decompressing the current data block in accordance with the encoding format specified by the immediate value.

22. The processor of claim 1, wherein to execute the single machine instruction, the processor is configured to:
  convert the single machine instruction to two or more microcode instructions; and
  execute the two or more microcode instructions.

* * * * *